(12) United States Patent
Von Novak, III et al.

(10) Patent No.: US 9,612,296 B2
(45) Date of Patent: Apr. 4, 2017

(54) METHODS AND APPARATUS FOR TESTING OF WIRELESS POWER TRANSMITTERS AND SYSTEMS

(71) Applicant: QUALCOMM Incorporated, San Diego, CA (US)

(72) Inventors: William Henry Von Novak, III, San Diego, CA (US); Mei-Li Chi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 14/876,719

(22) Filed: Oct. 6, 2015

(65) Prior Publication Data
US 2016/0103191 A1    Apr. 14, 2016

Related U.S. Application Data

(60) Provisional application No. 62/061,356, filed on Oct. 8, 2014.

(51) Int. Cl.
*G01R 33/02*    (2006.01)
*H02J 7/02*    (2016.01)
(Continued)

(52) U.S. Cl.
CPC ......... *G01R 33/02* (2013.01); *G01R 29/0892* (2013.01); *H02J 7/025* (2013.01);
(Continued)

(58) Field of Classification Search
CPC combination set(s) only.
See application file for complete search history.

(56) References Cited

U.S. PATENT DOCUMENTS

2004/0232776 A1* 11/2004 Ozaki ............... G01R 29/0878
307/149
2012/0235506 A1    9/2012 Kallal et al.
(Continued)

OTHER PUBLICATIONS

International Search Report and Written Opinion—PCT/US2015/054502 ISA/EPO—Apr. 15, 2015.

*Primary Examiner* — Clayton E LaBalle
*Assistant Examiner* — Jas Sanghera
(74) *Attorney, Agent, or Firm* — Knobbe Martens Olson & Bear LLP

(57) ABSTRACT

This disclosure provides methods and apparatus for wireless power field testing. A method for generating testing the interoperability of a wireless power transmitter with one or more wireless power receivers is provided. The method includes generating a magnetic field via a transmit antenna. The method further includes measuring a first uniformity of the magnetic field at all the locations within the magnetic field on a charging surface of the wireless power transmitter. The method also includes determining that the measure first uniformity of the magnetic field is within a range of values at all locations on the charging surface of the wireless power transmitter. In some implementations, the method further includes applying a load to the magnetic field, measuring a second uniformity of the magnetic field while the load is applied, and determining if the first uniformity of the magnetic field is substantially similar to the second uniformity.

30 Claims, 10 Drawing Sheets

(51) Int. Cl.
*G01R 29/08* (2006.01)
*H04B 5/00* (2006.01)
*G01R 29/10* (2006.01)

(52) U.S. Cl.
CPC ........... *H04B 5/0037* (2013.01); *G01R 29/10* (2013.01); *H04B 5/0081* (2013.01)

(56) References Cited

U.S. PATENT DOCUMENTS

| | | |
|---|---|---|
| 2013/0300206 A1 | 11/2013 | Kim et al. |
| 2014/0070621 A9 | 3/2014 | Von Novak et al. |
| 2014/0091634 A1 | 4/2014 | Mayo et al. |

* cited by examiner

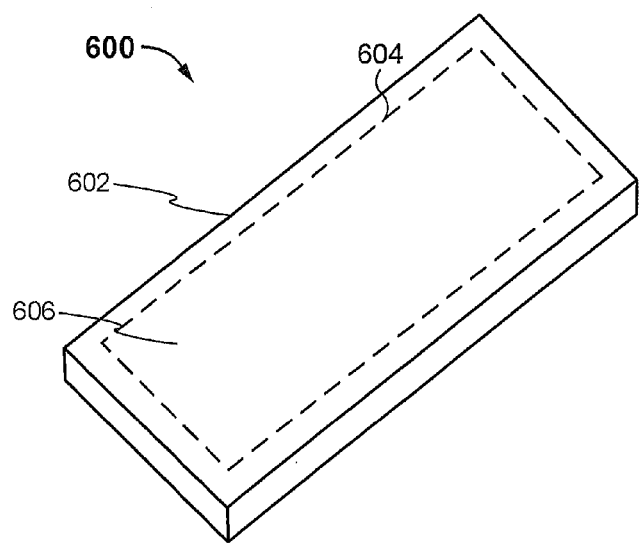
FIG. 6
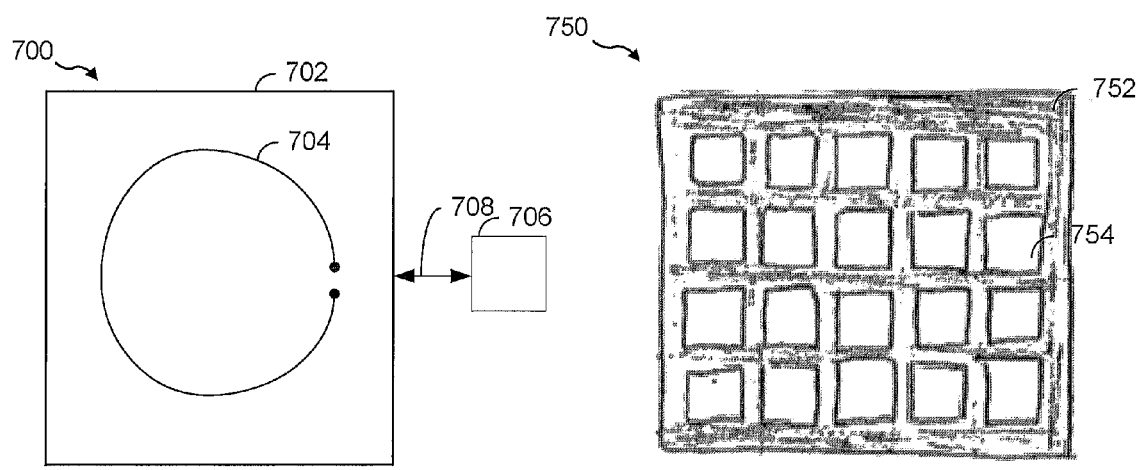
FIG. 7A
FIG. 7B

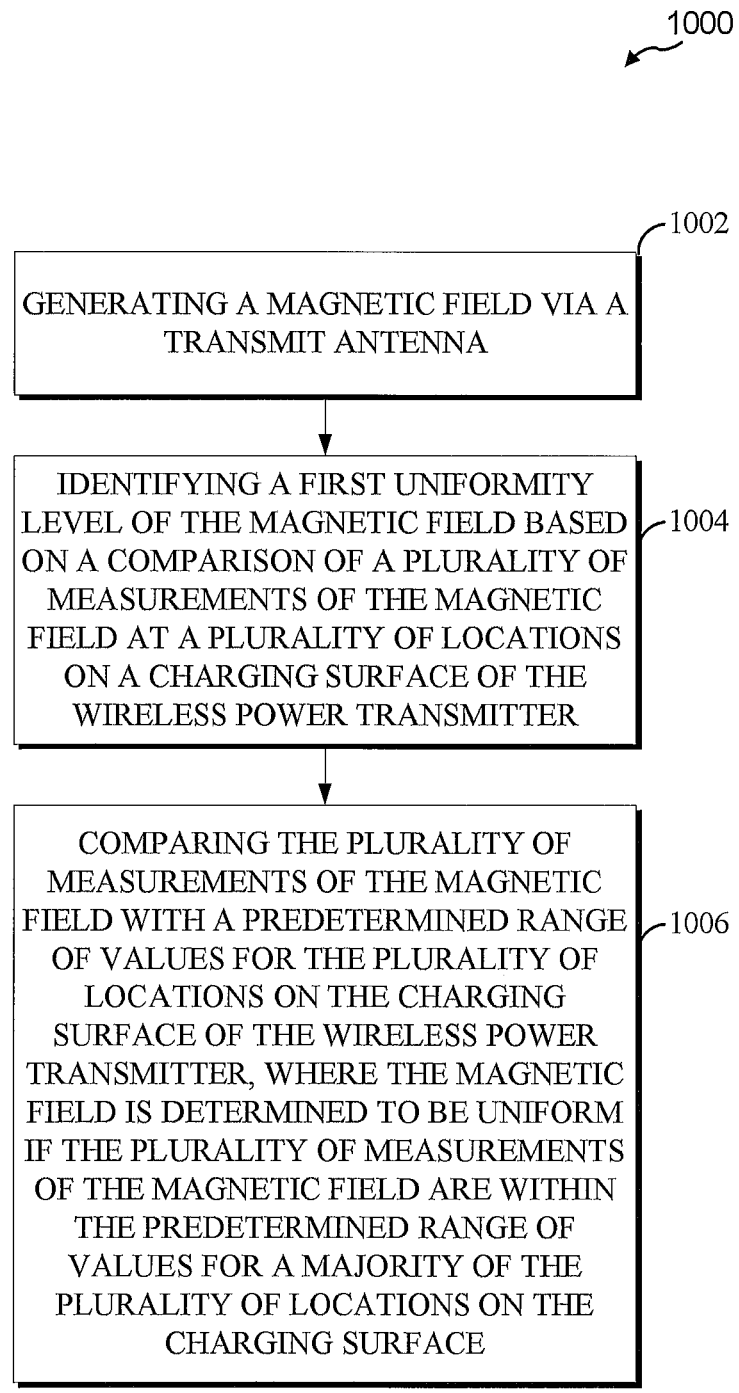

METHODS AND APPARATUS FOR TESTING OF WIRELESS POWER TRANSMITTERS AND SYSTEMS

CROSS REFERENCE TO RELATED APPLICATIONS

This application claims the benefit of U.S. Provisional Application No. 62/061,356, filed Oct. 8, 2014, and entitled "METHODS AND APPARATUS FOR TESTING OF WIRELESS POWER TRANSMITTERS AND SYSTEMS" and assigned to the assignee hereof. The disclosure of this prior application is considered part of this application, and is hereby incorporated by reference in its entirety.

FIELD

The present disclosure relates generally to wireless power transfer, and more specifically to methods and apparatus for testing wireless power transmitters and systems.

BACKGROUND

In wireless power applications, wireless power charging systems may provide the ability to charge and/or power electronic devices without physical, electrical connections, thus reducing the number of components required for operation of the electronic devices and simplifying the use of the electronic device. Such wireless power charging systems may comprise a wireless power transmitter and other transmitting circuitry configured to generate a magnetic field that may be used to wirelessly transfer power to wireless power receivers. There is a need for improved methods and apparatus for testing wireless power transmitters and systems and their ability to transfer power wirelessly to wireless power receivers.

SUMMARY

Various implementations of methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the invention includes a method for testing a wireless power transmitter. The method comprises generating a magnetic field via a transmit antenna. The method further comprises identifying a first uniformity level of the magnetic field based on a comparison of a plurality of measurements of the magnetic field at a plurality of locations on a charging surface of the wireless power transmitter. The method also comprises comparing the plurality of measurements of the magnetic field with a predetermined range of values for the plurality of locations on the charging surface of the wireless power transmitter, where the magnetic field is determined to be uniform if the plurality of measurements of the magnetic field are within the predetermined range of values for a majority of the plurality of locations on the charging surface.

Another aspect of the invention includes another method of testing a wireless power transmitter. The other method comprises generating a magnetic field via a transmit antenna. The other method also comprises measuring a plurality of values indicative of a magnitude of the magnetic field at a plurality of locations of a charging surface of the wireless power transmitter. The other method further comprises determining that the plurality of values indicative of the magnitude of the magnetic field is within a predetermined range of values at the plurality of locations.

Another aspect of the invention includes a system for testing a wireless power transmitter. The system comprises a measurement device configured to measure a plurality of values indicative of a magnitude of a magnetic field generated by a transmit antenna of the wireless power transmitter at a plurality of locations of a charging surface of the wireless power transmitter. The system further comprises a processor configured to determine that the plurality of values indicative of the magnitude of the magnetic field is within a predetermined range of values at the plurality of locations.

Another aspect of the invention includes another system for testing a wireless power transmitter. The other system comprises means for measuring a plurality of values indicative of a magnitude of a magnetic field generated by a transmit antenna of the wireless power transmitter at a plurality of locations of a charging surface of the wireless power transmitter. The other system further comprises means for determining that the plurality of values indicative of the magnitude of the magnetic field is within a predetermined range of values at the plurality of locations.

BRIEF DESCRIPTION OF THE DRAWINGS

FIG. 6 illustrates a perspective view of a wireless power transmitter having an enclosure configured for placement of wireless power receivers, in accordance with various exemplary implementations of the present invention.

FIG. 7A is a diagram illustrating a bottom view of a field test tool (FTT) for magnetic field testing of a wireless power transmitter, in accordance with an exemplary implementation.

FIG. 7B is a diagram illustrating a top view of an implementation of a reactance test tool (RTT) for magnetic field testing of a wireless power transmitter, in accordance with another exemplary implementation.

FIG. 10 is a flowchart of an exemplary method for testing of a wireless power transmitter, in accordance with an exemplary implementation.

Figure 1:
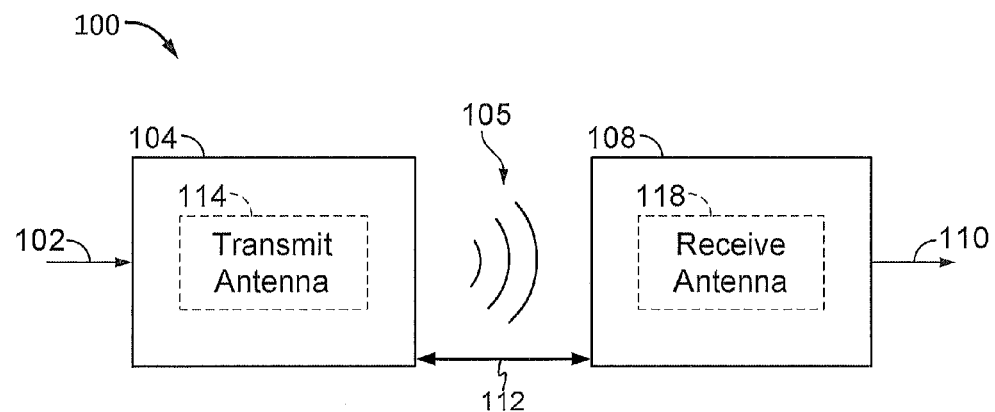
FIG. 1 is a functional block diagram of a wireless power transfer system, in accordance with one exemplary implementation.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specified details for the purpose of providing a thorough understanding of the exemplary implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

FIG. 1 is a functional block diagram of a wireless power transfer system 100, in accordance with one exemplary implementation. Input power 102 may be provided to a transmitter 104 from a power source (not shown) to generate a wireless (e.g., magnetic or electromagnetic) field 105 for performing energy transfer. A receiver 108 may couple to the wireless field 105 and generate output power 110 for storing or consumption by a device (not shown) coupled to the output power 110. Both the transmitter 104 and the receiver 108 are separated by a distance 112.

In one exemplary implementation, the transmitter 104 and the receiver 108 are configured according to a mutual resonant relationship. When the resonant frequency of the receiver 108 and the resonant frequency of the transmitter 104 are substantially the same or very close, transmission losses between the transmitter 104 and the receiver 108 are reduced. As such, wireless power transfer may be provided over a larger distance in contrast to purely inductive solutions that may require large antenna coils which are very close (e.g., sometimes within millimeters). Resonant inductive coupling techniques may thus allow for improved efficiency and power transfer over various distances and with a variety of inductive coil configurations.

The receiver 108 may receive power when the receiver 108 is located in the wireless field 105 produced by the transmitter 104. The wireless field 105 corresponds to a region where energy output by the transmitter 104 may be captured by the receiver 108. The wireless field 105 may correspond to the "near-field" of the transmitter 104 as will be further described below. The transmitter 104 may include a transmit antenna 114 (e.g., a coil) for transmitting energy to the receiver 108. The receiver 108 may include a receive antenna or coil 118 for receiving or capturing energy transmitted from the transmitter 104. The near-field may correspond to a region in which there are strong reactance fields resulting from the currents and charges in the transmit antenna 114 that minimally radiate power away from the transmit antenna 114. The near-field may correspond to a region that is within about one wavelength (or a fraction thereof) of the transmit antenna 114.

Figure 2:
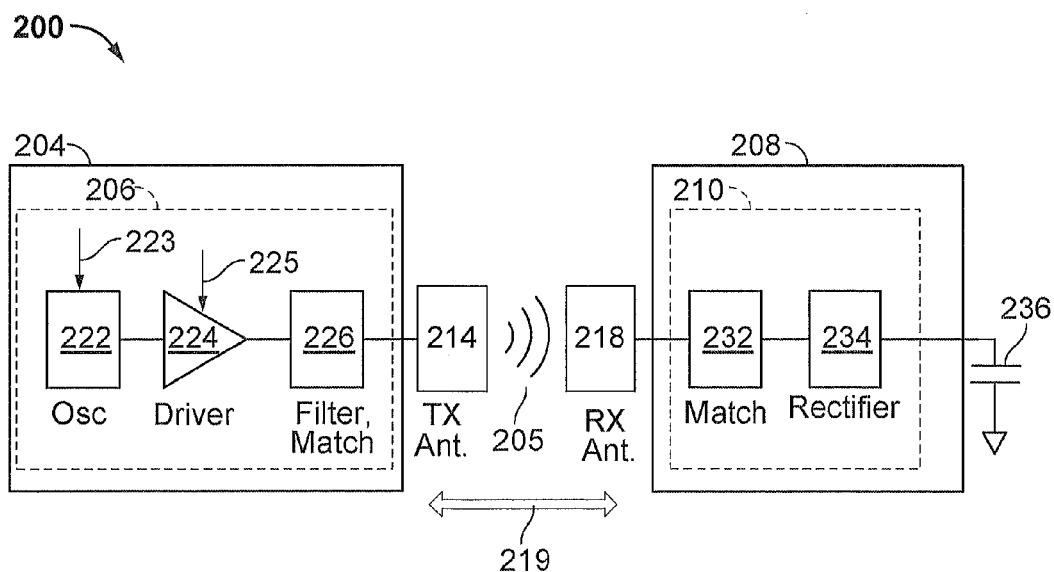
FIG. 2 is a functional block diagram of a wireless power transfer system, in accordance with another exemplary implementation.

FIG. 2 is a functional block diagram of a wireless power transfer system 200, in accordance with another exemplary implementation. The system 200 includes a transmitter 204 and a receiver 208. The transmitter 204 may include a transmit circuitry 206 that may include an oscillator 222, a driver circuit 224, and a filter and matching circuit 226. The oscillator 222 may be configured to generate a signal at a desired frequency that may be adjusted in response to a frequency control signal 223. The oscillator 222 may provide the oscillator signal to the driver circuit 224. The driver circuit 224 may be configured to drive the transmit antenna 214 at, for example, a resonant frequency of the transmit antenna 214 based on an input voltage signal $(V_D)$ 225. The driver circuit 224 may be a switching amplifier configured to receive a square wave from the oscillator 222 and output a sine wave. For example, the driver circuit 224 may be a class E amplifier.

The filter and matching circuit 226 may filter out harmonics or other unwanted frequencies and match the impedance of the transmitter 204 to the impedance of the transmit antenna 214. As a result of driving the transmit antenna 214, the transmit antenna 214 may generate a wireless field 205 to wirelessly output power at a level sufficient for charging a battery 236.

The receiver 208 may include a receive circuitry 210 that may include a matching circuit 232 and a rectifier circuit 234. The matching circuit 232 may match the impedance of the receive circuitry 210 to the receive antenna 218. The rectifier circuit 234 may generate a direct current (DC) power output from an alternate current (AC) power input to charge the battery 236, as shown in FIG. 2. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205.

The receiver 208 may be configured to determine whether an amount of power transmitted by the transmitter 204 and received by the receiver 208 is appropriate for charging the battery 236.

Figure 3:
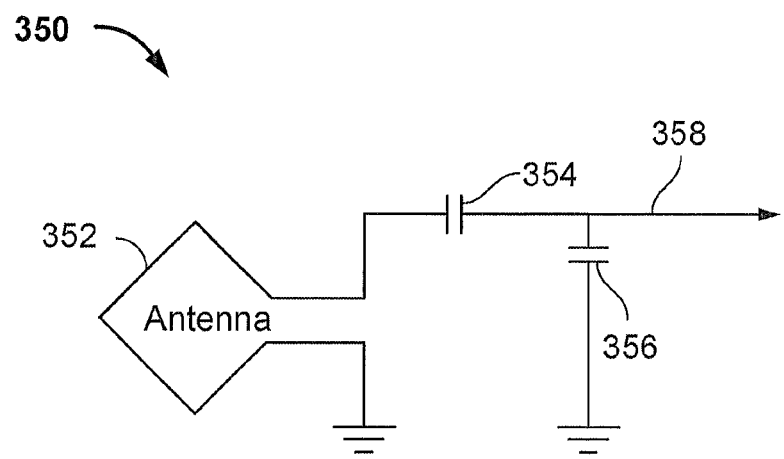
FIG. 3 is a schematic diagram of a portion of transmit circuitry or receive circuitry of FIG. 2 including a transmit or receive antenna, in accordance with exemplary implementations.

FIG. 3 is a schematic diagram of a portion of the transmit circuitry 206 or the receive circuitry 210 of FIG. 2 including a transmit or receive antenna, in accordance with exemplary implementations. As illustrated in FIG. 3, a transmit or receive circuitry 350 may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, the antenna 352 is an example of a "power transfer component" of a type that is configured to wirelessly output and/or receive power.

The antenna 352 may include an air core or a physical core such as a ferrite core (not shown).

The transmit or receive circuitry 350 may form/include a resonant circuit. The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, a capacitor 354 and a capacitor 356 may be added to the transmit or receive circuitry 350 to create a resonant circuit. For a transmit circuitry, a signal 358 may be an input at a resonant frequency to cause the antenna 352 to generate a wireless field 105/205. For receive circuitry, the signal 358 may be an output to power or charge a load (not shown). For example, the load may comprise a wireless device configured to be charged by power received from the wireless field.

Other resonant circuits formed using other components are also possible. As another non-limiting example, a capacitor may be placed in parallel between the two terminals of the circuitry 350.

Referring to FIGS. 1 and 2, the transmitter 104/204 may output a time varying magnetic (or electromagnetic) field with a frequency corresponding to the resonant frequency of the transmit antenna 114/214. When the receiver 108/208 is within the wireless field 105/205, the time varying magnetic (or electromagnetic) field may induce a current in the receive antenna 118/218. As described above, if the receive antenna 118/218 is configured to resonate at the frequency of the transmit antenna 114/214, energy may be efficiently transferred. The AC signal induced in the receive antenna 118/218 may be rectified as described above to produce a DC signal that may be provided to charge or to power a load.

Figure 4:
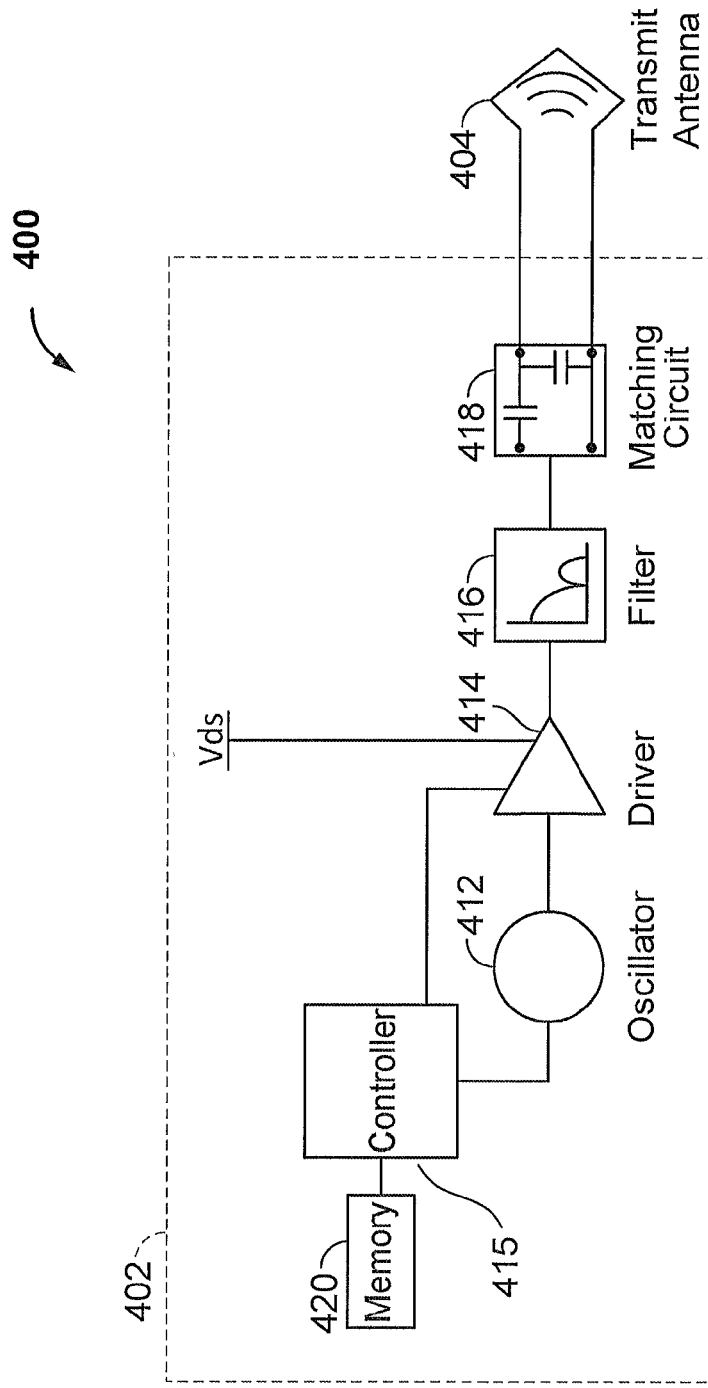
FIG. 4 is a simplified functional block diagram of a transmitter that may be used in an inductive power transfer system, in accordance with exemplary implementations of the invention.

FIG. 4 is a simplified functional block diagram of a transmitter that may be used in an inductive power transfer system, in accordance with exemplary implementations of the invention. As shown in FIG. 4, the transmitter 400 includes transmit circuitry 402 and a transmit antenna 404 operably coupled to the transmit circuitry 402. The transmit antenna 404 may be configured as the transmit antenna 214 as described above in reference to FIG. 2. In some implementations, the transmit antenna 404 may be a coil (e.g., an induction coil). In some implementations, the transmit antenna 404 may be associated with a larger structure, such as a table, mat, lamp, or other stationary configuration. The transmit antenna 404 may be configured to generate an electromagnetic or magnetic field. In an exemplary implementation, the transmit antenna 404 may be configured to transmit power to a receiver device within a charging region at a power level sufficient to charge or power the receiver device.

The transmit circuitry 402 may receive power through a number of power sources (not shown). The transmit circuitry 402 may include various components configured to drive the transmit antenna 404. In some exemplary implementations, the transmit circuitry 402 may be configured to adjust the transmission of wireless power based on the presence and constitution of the receiver devices as described herein. As such, the transmitter 400 may provide wireless power efficiently and safely.

The transmit circuitry 402 may further include a controller 415. In some implementations, the controller 415 may be a micro-controller. In other implementations, the controller 415 may be implemented as an application-specified integrated circuit (ASIC). The controller 415 may be operably connected, directly or indirectly, to each component of the transmit circuitry 402. The controller 415 may be further configured to receive information from each of the components of the transmit circuitry 402 and perform calculations based on the received information. The controller 415 may be configured to generate control signals for each of the components that may adjust the operation of that component. As such, the controller 415 may be configured to adjust the power transfer based on a result of the calculations performed by it.

The transmit circuitry 402 may further include a memory 420 operably connected to the controller 415. The memory 420 may comprise random-access memory (RAM), electrically erasable programmable read only memory (EEPROM), flash memory, or non-volatile RAM. The memory 420 may be configured to temporarily or permanently store data for use in read and write operations performed by the controller 415. For example, the memory 420 may be configured to store data generated as a result of the calculations of the controller 415. As such, the memory 420 allows the controller 415 to adjust the transmit circuitry 402 based on changes in the data over time.

The transmit circuitry 402 may further include an oscillator 412 operably connected to the controller 415. The oscillator 412 may be configured as the oscillator 222 as described above in reference to FIG. 2. The oscillator 412 may be configured to generate an oscillating signal (e.g., radio frequency (RF) signal) at the operating frequency of the wireless power transfer. In some exemplary implementations, the oscillator 412 may be configured to operate at the 6.78 MHz ISM frequency band. The controller 415 may be configured to selectively enable the oscillator 412 during a transmit phase (or duty cycle). The controller 415 may be further configured to adjust the frequency or a phase of the oscillator 412 which may reduce out-of-band emissions, especially when transitioning from one frequency to another. As described above, the transmit circuitry 402 may be configured to provide an amount of power to the transmit antenna 404, which may generate energy (e.g., magnetic flux) about the transmit antenna 404.

The transmit circuitry 402 may further include a driver circuit 414 operably connected to the controller 415 and the oscillator 412. The driver circuit 414 may be configured as the driver circuit 224 as described above in reference to FIG. 2. The driver circuit 414 may be configured to drive the signals received from the oscillator 412, as described above.

The transmit circuitry 402 may further include a low pass filter (LPF) 416 operably connected to the transmit antenna 404. The low pass filter 416 may be configured as the filter portion of the filter and matching circuit 226 as described above in reference to FIG. 2. In some exemplary implementations, the low pass filter 416 may be configured to receive and filter an analog signal of current and an analog signal of voltage generated by the driver circuit 414. The analog signal of current may comprise a time-varying current signal, while the analog signal of current may comprise a time-varying voltage signal. In some implementations, the low pass filter 416 may alter a phase of the analog signals. The low pass filter 416 may cause the same amount of phase change for both the current and the voltage, canceling out the changes. In some implementations, the controller 415 may be configured to compensate for the phase change caused by the low pass filter 416. The low pass filter 416 may be configured to reduce harmonic emissions to levels that may prevent self-jamming. Other exemplary implementations may include different filter topologies, such as notch filters that attenuate specified frequencies while passing others.

The transmit circuitry 402 may further include a fixed impedance matching circuit 418 operably connected to the low pass filter 416 and the transmit antenna 404. The matching circuit 418 may be configured as the matching portion of the filter and matching circuit 226 as described above in reference to FIG. 2. The matching circuit 418 may be configured to match the impedance of the transmit circuitry 402 (e.g., 50 ohms) to the transmit antenna 404. Other exemplary implementations may include an adaptive impedance match that may be varied based on measurable transmit metrics, such as the measured output power to the transmit antenna 404 or a DC current of the driver circuit 414. The transmit circuitry 402 may further comprise discrete devices, discrete circuits, and/or an integrated assembly of components. Transmit antenna 404 may be implemented as an antenna strip with the thickness, width and metal type selected to keep resistance losses low.

Figure 5:
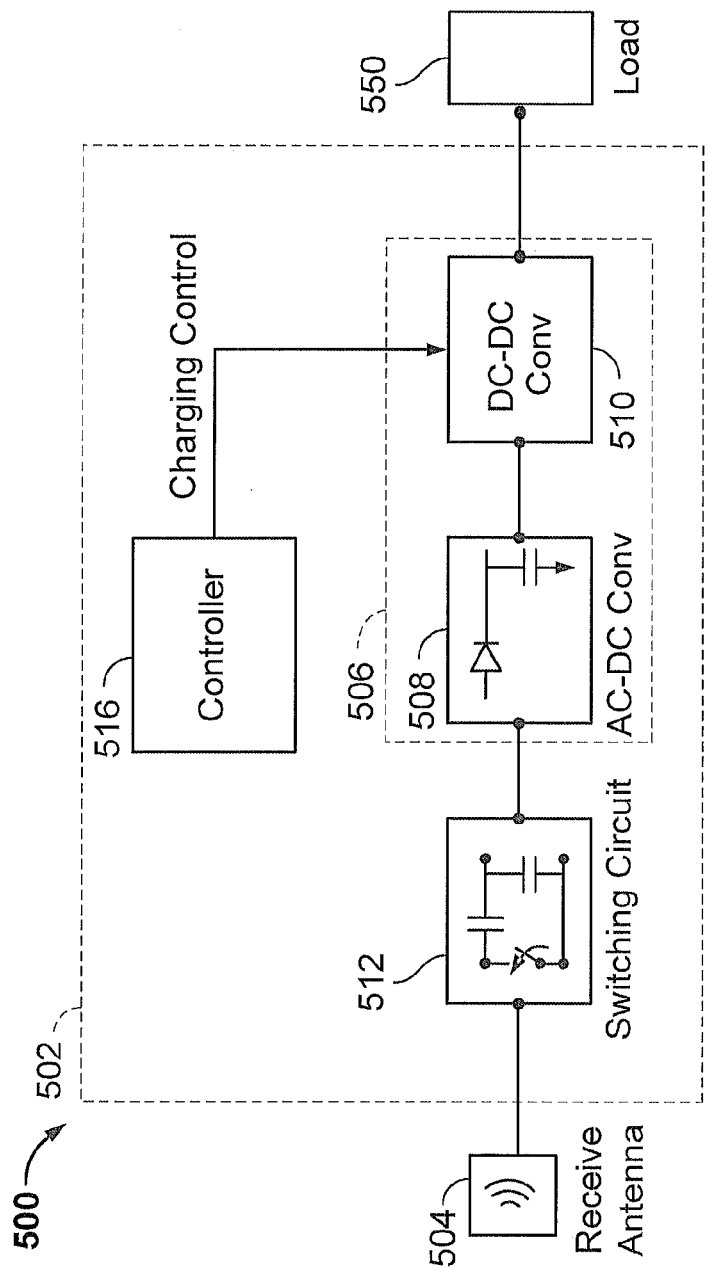
FIG. 5 is a simplified functional block diagram of a receiver that may be used in the inductive power transfer system, in accordance with exemplary implementations of the invention.

FIG. 5 is a block diagram of a receiver, in accordance with an implementation of the present invention. As shown in FIG. 5, a receiver 500 includes a receive circuitry 502, a receive antenna 504, and a load 550. The receiver 500 further couples to the load 550 for providing received power thereto. Receiver 500 is illustrated as being external to device acting as the load 550 but may be integrated into load 550. The receive antenna 504 may be operably connected to the receive circuitry 502. The receive antenna 504 may be configured as the receive antenna 218 as described above in reference to FIG. 2. In some implementations, the receive antenna 504 may be tuned to resonate at a frequency similar to a resonant frequency of the transmit antenna 404, or within a specified range of frequencies, as described above. The receive antenna 504 may be similarly dimensioned with transmit antenna 404 or may be differently sized based upon the dimensions of the load 550. The receive antenna 504 may be configured to couple to the magnetic field generated by the transmit antenna 404, as described above, and provide an amount of received energy to the receive circuitry 502 to power or charge the load 550.

The receive circuitry 502 may be operably coupled to the receive antenna 504 and the load 550. The receive circuitry may be configured as the receive circuitry 210 as described above in reference to FIG. 2. The receive circuitry 502 may be configured to match an impedance of the receive antenna 504, which may provide efficient reception of wireless power. The receive circuitry 502 may be configured to generate power based on the energy received from the receive antenna 504. The receive circuitry 502 may be configured to provide the generated power to the load 550. In some implementations, the receiver 500 may be configured to transmit a signal to the transmitter 400 indicating an amount of power received from the transmitter 400. The receive circuitry 502 may include a processor-signaling controller 516 configured to coordinate the processes of the receiver 500 described below.

The receive circuitry 502 provides an impedance match to the receive antenna 504. The receive circuitry 502 includes power conversion circuitry 506 for converting a received energy into charging power for use by the load 550. The power conversion circuitry 506 includes an RFAC-to-DC converter 508 coupled to a DC-to-DC converter 510. The AC-to-DC converter 508 rectifies the energy signal received at the receive antenna 504 into a non-alternating power while the DC-to-DC converter 510 converts the rectified energy signal into an energy potential (e.g., voltage) that is compatible with the load 550. Various AC-to-DC converters are contemplated including partial and full rectifiers, regulators, bridges, doublers, as well as linear and switching converters.

The receive circuitry 502 may further include switching circuitry 512 configured to connect the receive antenna 504 to the power conversion circuitry 506 or alternatively for disconnecting the power conversion circuitry 506 from the receive antenna 504. Disconnecting the receive antenna 504 from the power conversion circuitry 506 not only suspends charging of the load 550, but also changes the "load" as "seen" by the transmitter 400 (FIG. 4) as is explained more fully below.

The load 550 may be operably connected to the receive circuitry 502. The load 550 may be configured as the battery 236 as described above in reference to FIG. 2. In some implementations the load 550 may be external to the receive circuitry 502. In other implementations the load 550 may be integrated into the receive circuitry 502.

When designing wireless power systems, several important tasks may be performed during design and testing including measurement of the total magnetic field density (H) and/or magnetic flux density (B), measurement of field evenness in open coil cases, testing of the interoperability of a wireless power transmitter with wireless power receivers, monitoring the magnetic flux density once a chargeable device has been placed, and monitoring a wireless power transmitter's ability to maintain the magnetic field when under a load from a given set of power receivers. Testing of the interoperability of a new wireless power transmitter may involve testing the new wireless power transmitter with every existing receiver, while testing of the magnetic field density or magnetic flux density may be performed by moving a loop (i.e., a receiver) around the wireless power transmitter. However, it is difficult and impractical to test a new wireless power transmitter with all existing receivers as the number of wireless power transmitters and receivers continually increases. Similarly, it is difficult and impractical to move and place a loop accurately over tens or hundreds of locations on the pad and measure the magnetic field density and the magnetic flux density at the location. As such, there is a need for improved methods and apparatus for testing wireless power transmitters and systems.

FIG. 6 illustrates a perspective view of a wireless power transmitter 600 having an enclosure 602 configured for placement of wireless power receivers thereon, for example receiver 500 of FIG. 5, in accordance with various exemplary implementations of the present invention. In some implementations, the transmitter 600 may correspond to transmitter 402 of FIG. 4. In some implementations, the wireless power receivers may be configured to receive power wirelessly from the wireless power transmitter 600 for charging the wireless power receivers. In some implementations, the wireless power transmitter 600 may include the enclosure 602 housing therein a transmit antenna 604 and associated transmitter circuitry and components as previously described in connection with FIGS. 1-4. The transmit antenna 604 may be configured to generate a wireless field for transferring power wirelessly from a signal generated by the associated transmitter circuitry. The associated transmitter circuitry may comprise one or more of the components of transmitter 402 of FIG. 4, for example, the oscillator 412, the driver 414, the filter 416, and the matching circuit 418.

The enclosure 602 may be configured to have one or more surfaces 606 capable of operating as a charging surface. Wireless power receivers may be placed on the charging surface 606 and be exposed to the wireless field generated by the transmit antenna 604. The transmit antenna 604 may be located within the enclosure 602 such that the wireless field generated by the transmit antenna 604 enables wireless power transfer to any wireless power receiver placed on the one or more charging surfaces 606 of the enclosure 602.

The wireless field generated by the transmit antenna 604 to wirelessly transmit power may be a magnetic field. The magnetic field may be generated at a specified frequency or within a specified range of frequencies. In some implementations, the wireless power transmitter 600 may comprise a plurality of transmit antennas arranged in an array. Each of the transmit antennas of the plurality of transmit antennas may be configured to generate a magnetic field to transfer power wirelessly. As described above, the magnetic fields generated by each of the plurality of transmit antennas may be generated at a specified frequency (i.e., the same specified frequency for each of the magnetic fields) or at a specified range of frequencies (i.e., each of the magnetic fields may be generated at one of a range of specified frequencies).

In operation, the wireless power transmitter 600 having the transmit antenna 604 may generate and maintain the magnetic field (H-field) at the specified frequency or specified range of frequencies. The strength of the generated magnetic field, in combination with the specified frequency, may determine the voltage that the wireless power receiver(s) exposed to the magnetic field will receive via the magnetic field. The magnetic field may act as an interface between the wireless power transmitter 600 and the wireless power receiver.

For effective wireless power transfer, the wireless power transmitter 600 may be capable of maintaining the magnetic field and specified frequency relationship such that the product of the two (i.e., the voltage available to wireless power receivers) falls within a predetermined or specified range across the charging surface 606. For example, it is desirable if positions on and within the charging surface 606 of the wireless power transmitter 600 produce a voltage within the specified range. In certain implementations, the magnetic field/frequency product of the wireless power transmitter 600 is maintained within the specified range by varying the current and/or the frequency through the transmit antenna 604. In certain implementations, the geometry of the transmit antenna 604 is selected to maintain the magnetic field/frequency product of the wireless power transmitter 600 within the specified range.

To determine whether the magnetic field is within the specified range, the magnetic field is measured at a location away from the load. The load may correspond to the device or object that is presented to the transmit antenna for purposes of receiving power from the magnetic field, for example a chargeable device (e.g., a mobile phone, laptop computer, etc.) or a test device that receives wireless power from the magnetic field. In some implementations, when the load is presented to the transmit antenna, the load is placed on an area of the charging surface 606 of the wireless power transmitter 600. For example, a "loaded" magnetic field may correspond to a magnetic field that is transferring power to the chargeable device, while an "unloaded" magnetic field may correspond to a magnetic field that is not transferring power to the chargeable device. If the measured magnetic field is uniform within a uniformity specification, then wireless power transmitter 600 is capable of maintaining the magnetic field while supplying power to the load as well. Thus, the magnetic field of the transmitter 600 is within the specified range if the uniformity of the magnetic field is maintained at the points that are not specifically loaded. Thus, in accordance with one implementation a method is provided that tests the uniformity of the magnetic field at points or locations within the magnetic field that are not explicitly loaded. In some implementations, when the magnetic field is measured at a location away from the load, the magnetic field may be measured at all locations away from the load. In other implementations, the magnetic field may be measured at a majority of locations away from the load. Some other implementations may measure the magnetic field as a subset of locations away from the load based on an algorithm.

When a new wireless power transmitter 600 is designed and developed, the wireless power transmitter 600 is tested to determine whether it operates as designed and/or specified with a given set of wireless power receivers. As described above, one method of testing may comprise testing the new wireless power transmitter 600 with all existing wireless power receivers. Alternatively, in one implementation, the new wireless power transmitter 600 may be tested by examining the magnetic field generated by the wireless power transmitter 600. The uniformity of the unloaded wireless power transmitter may be compared against a uniformity standard to ensure that the no-load magnetic field meets uniformity requirements. The uniformity of an unloaded magnetic field may then be compared with the uniformity requirement. This uniformity requirement may be the same as the requirement for the unloaded field, or it may be more or less stringent. The load or loads can represent the minimum and maximum range of conceivable wireless power receivers. For example, the magnetic field generated by the wireless power transmitter 600 when unloaded may be sampled or measured at one or more points within the magnetic field. The load (or loads if the wireless power transmitter 600 is configured to provide power to multiple wireless power receivers at once) is then placed within the magnetic field, and the magnetic field is again sampled or measured at remaining unloaded points. Then, measurements of the unloaded magnetic field are compared with a uniformity standard. If the measured magnetic fields at the unloaded points deviate from the uniformity standard, then the test may fail. If the measured magnetic fields at the unloaded points are within the uniformity standard, then the test may pass. In some implementations, the magnetic field generated by the wireless power transmitter 600 may be distorted by any metal or magnetic material within the wireless power receiver and/or by the resonance of the wireless power receiver. Alternatively, a wireless power receiver with a substantial load (e.g., a substantial current draw) may disrupt the magnetic field.

As discussed above, testing the wireless power transmitter 600 may involve measuring or sampling the magnetic field generated by the wireless power transmitter 600 at one or more points within the magnetic field. Such measuring and sampling may involve the use of a field test tool (FTT). As one example, the field test tool may comprise a loop of wire that is approximately the same size as the wireless power receiver it is intended to represent. Therefore, testing a wireless power transmitter 600 that is capable of providing wireless power to a variety of sizes of wireless power receivers may involve using a plurality of field test tools each corresponding to a size of a particular wireless power receiver capable of receiving wireless power from the wireless power transmitter 600. In some implementations, the field test tool may comprise any external device (external to the wirelessly power transmitter 600 itself) that may be used to place a load on the wireless power transmitter 600 or measure any parameter or specification of the wireless power transmitter 600 or the magnetic field the wireless power transmitter 600 generates. In some implementations, the field test tool may be configured to simulate a load or an impedance to be presented to the magnetic field.

FIG. 7A is a diagram illustrating a bottom view of the field test tool 700 for magnetic field testing of a wireless power transmitter, for example wireless power transmitter 600 of FIG. 6, in accordance with an exemplary implementation. As shown by FIG. 7A, the field test tool 700 may comprise an enclosure 702 (e.g., a plastic enclosure), may be configured to include a sense loop 704, and may be coupled to a testing circuit 706. The sense loop 704 may be a loop of wire. In some implementations, the apparatus 700 may comprise overlapping sense loops 704, an array of sense loops 704, or one or more planar sense loops 704. In some implementations, the sense loop 704 may be embedded within the enclosure 702 or enclosed within the enclosure 702. In some implementations, the sense loop 704 may be operably coupled to the outside of the enclosure 702 on a side closest to the wireless power transmitter 600 when testing the wireless power transmitter 600. In some implementations, the field test tool 700 may include a metal backing or a ferrite backing (not shown). The testing circuit 706 may comprise one or more components or circuits (e.g., a detection circuit) that identify magnetic field measurements based on magnetic fields to which the sense loop 704 is exposed.

As depicted in FIG. 7A, the sense loop 704 may be substantially circular. In some implementations, the sense loop 704 may be a multi-turn loop or coil of electrically conductive wire. The sense loop 704 may be electrically coupled to the testing circuit 706 by a lead line 708. Since the sense loop 704 may have a substantially circular cross section, the field test tool 700 may be rotated in any direction perpendicular to the cross section of the sense loop 704 without affecting the magnetic field measurement. In some implementations, the field test tool 700 may comprise a location sensor, which may be configured to sense and/or measure a change in relative location of the field test tool 700 during the magnetic field measurement. In some implementations, the location sensor may be a component of the testing circuit 706.

In some implementations, the location sensor may comprise an optical sensor that operates similar to that of an optically tracked computer mouse. In some other implementations, the location sensor may comprise a mechanical location sensor (e.g., a rollerball as utilized in a computer mouse). However, any sensor type capable of delineating relative movement of the field test tool 700 may alternatively be utilized.

The field test tool 700 may be a handheld apparatus that may be moved around a surface of the wireless power transmitter 600 and may be configured to map the magnetic field (as sensed by the sense loop 704) at each of a plurality of locations across the wireless power transmitter 600 (as sensed by the location sensor). The field test tool 700 may be connected to an AC voltmeter and a display to allow a field plot to be filled in as the field test tool 700 is moved across the surface of the wireless power transmitter 600. In some implementations, the field test tool 700 may be connected to the display to guide a user when scanning the surface of the wireless power transmitter 600. In some other implementations, a user of the field test tool 700 may additionally utilize a printed, flexible guide that allows accurate placement and motion of the field test tool 700. In yet some other implementations, a user of the field test tool 700 may additionally utilize some other means for marking a surface of the wireless power transmitter 600 to guide the user in positioning the field test tool 700.

In some implementations, the field test tool 700 may be configured to present a resistive load (within a resistance range) and a reactance shift (within a reactance range) to the wireless power transmitter 600. In some other implementations, the field test tool 700 will not be an item used to resistively or reactively shift load the wireless power transmitter 600. In such implementations, the resistive or reactive shift loads may be presented by an external device. In one implementation, the resistive load may be accomplished by varying the electrical resistance connected to the sense loop 704. The reactance shift may be varied by changing the material behind the sense loop 704, for example, changing inserts or the physical backing of the field test tool 700. The configuration of the field test tool 700 may depend at least in part on the test in which the field test tool 700 is being used.

The field test tool 700 may function to measure the magnetic field at a location of the field test tool 700. The field test tool 700 may measure or calculate the magnetic field passing through the field test tool 700 based on a voltage and a frequency of a signal induced in the sense loop 704 and an area of the sense loop 704. The field test tool 700 may average the magnetic field over the area of the sense loop 704. The resulting measurement may be expressed as a voltage.

FIG. 7B is a diagram illustrating a top view of a reactance test tool (RTT) 750 for magnetic field testing of a wireless power transmitter, for example wireless power transmitter 600 of FIG. 6, in accordance with an exemplary implementation. As shown by FIG. 7B, the reactance test tool 750 may be formed substantially of metal or ferrite 752 comprising an arrangement of one or more "holes" 754, where a controlled amount of metal or ferrite may be removed in a fine pattern. The reactance test tool 750 may provide an "average" reactance shift that is independent of the position of the reactance test tool 750, so long as the RT reactance test tool T 750 is large enough to cover the entire charging surface of the wireless power transmitter 600.

The field test tool 700 or reactance test tool 750 may be used in a variety of tests of the wireless power transmitters 600. Two exemplary types of tests that may be used for testing wireless power transmitters 600 may be divided into two types of tests with regards to the aspects of the wireless power transmitter 600 being tested (i.e., operational tests and design tests). The operational test may test elements of performance that effect operation of the wireless power transmitter 600. The design test may ensure that the wireless power transmitter 600 can be easily implemented using real-world hardware but may not have substantial effect on the operation of the wireless power transmitter 600 (i.e., the design test may be important to designing the wireless power transmitter 600). In these types of tests, the field test tools 700 and reactance test tools 750 may represent different parameters depending on the test. Of course, more than one operational test and/or more than one design test can be performed on the wireless power transmitter 600.

In some implementations, the field test tool 700/reactance test tool 750 may comprise a controller and a communication module or be configured to couple to an external controller and/or communication module. The controller may be configured to perform the measurements of the open circuit voltages and determine a uniformity of the magnetic field during the measurements performed by the field test tool 700. In some implementations, the controller may be configured to determine if the wireless power transmitter 600 passes or fails the tests described below by comparing measured values of the strength of the magnetic field before the load is applied to the measured values of the strength of the magnetic field after the load is applied. In some implementations, one or more field test tools 700/reactance test tools 750 may be used as a load on the generated magnetic field, while one or more other field test tools 700 may be used to measure the generated magnetic field at the unloaded points or locations. In some implementations, field test tools 700/reactance test tools 750 may be used as the loads on the magnetic fields generated by the wireless power transmitters 600 while other probes, devices, or measuring tools are used to measure the uniformity of the magnetic field outside the loaded points or locations. In some implementations, the communication module may be used to communicate any measured values or receive any settings or commands to and from another device, respectively. In some implementations, the field test tool 700 may be used in conjunction with another device configured to simulate a load, where the field test tool 700 may be used to measure the magnetic field while loaded with the other device.

A first operational test may comprise an open circuit test. In this test, the field test tool 700 may represent an open circuit and may be configured to measure an open circuit voltage at locations on the wireless power transmitter 600 charging surface 606. To pass the open circuit test, the magnetic field must be capable of producing the open circuit voltage measured by the field test tool 700 within a specified range for the locations. If the locations of the open circuit voltages measured by the field test tool 700 for the locations are not within the specified range, then the wireless power transmitter 600 fails the open circuit test. The locations may cover substantially the entire charging surface 606 (FIG. 6).

A second operational test may comprise a resistance range test. For the resistance range test, the field test tool 700 or another wireless power receiver may represent a resistive load (i.e., the amount of power that a wireless power receiver may consume) that is placed on the wireless power transmitter 600. The resistance range test may involve the field test tool 700 or the other wireless power receiver being configured to vary its resistance from a very high value (representing minimum power transfer) to a very low value (representing maximum power transfer). As resistance decreases, power transferred may increase, and, to pass the resistance range test, the wireless power transmitter 600 may be able to maintain magnetic field levels to be within a range of values during the minimum load and the maximum load (and any load therebetween). If the magnetic field is maintained at unloaded locations during each of the current draws, then the test indicates that the transmitter is capable of supporting the wireless power receivers with the maximum and minimum resistance values of the field test tool 700 or the other wireless power receiver.

If the wireless power transmitter 600 is capable of supporting more than one wireless power receiver at the same time, then several field test tools 700 or several other wireless power receivers may be used, each of the field test tools 700 or the several other wireless power receivers having placed on them their respective minimum and maximum current draws. If the wireless power transmitter 600 is capable of maintaining the magnetic field at the unloaded locations, then the wireless power transmitter 600 passes the test. For the resistance range test, while the ability for the wireless power transmitter 600 to maintain its transmitter antenna 604 current may be indicative of being able to maintain the magnetic field, there may be instances where the transmitter antenna 604 current is maintained but the magnetic field is not maintained. Thus, maintaining the magnetic field generated by the wireless power transmitter 600 may correspond to the wireless power transmitter 600 being able to maintain its transmitter loop current while being subject to the maximum load by one or more wireless power receivers. This may apply to both resistive and reactive shift tests. Maintaining the transmitter loop current may correspond to maintaining the transmitter loop current above a defined threshold (e.g., above 50% of the unloaded transmitter loop current or at a current sufficient to transfer power wirelessly to a minimum distance, etc.).

Either field test tool 700 or reactance test tool 750 may additionally be used in a design test, an example of which may be a reactance range test. The reactance range test may involve the reactance test tool 750 representing the reactance caused by the wireless power receivers on the wireless power transmitter 600 and transmitter antenna 604. To pass the reactance test, the wireless power transmitter 600 may be able to maintain the generated magnetic field (e.g., maintain magnetic field uniformity, magnetic field strength, and/or wireless power transfer properties, etc.) while experiencing a maximum reactance shift caused by the reactance test tool 750. The reactance shift may be in either direction—capacitive or inductive, depending on the material of the reactance test tool 750. If the field test tool 700 has a metal backing or the reactance test tool 750 is metal, then the reactance shift may be capacitive. If the field test tool 700 has a ferrite backing or the reactance test tool 750 is ferrite, then the reactance shift may be inductive. Generally, a large piece of metal or ferrite can be placed on a transmitter to cause the loading to become capacitive or inductive, respectively. Accordingly, the reactance test tool 750 may represent a maximum amount of metal you can put on the transmitter (e.g., a sheet of metal that covers half the transmitter or a sheet of metal that covers the entire transmitter but having holes that perforates the metal) or ferrite that you can put on the transmitter (or a device). For a multiple device wireless power transmitter 600, the same test is performed with multiple field test tools 700/reactance test tools 750, and the wireless power transmitter 600 may be able to maintain the generated magnetic field during the maximum reactance shift caused by the equivalent of the reactance shift of the maximum number of wireless power receivers.

Figure 8:
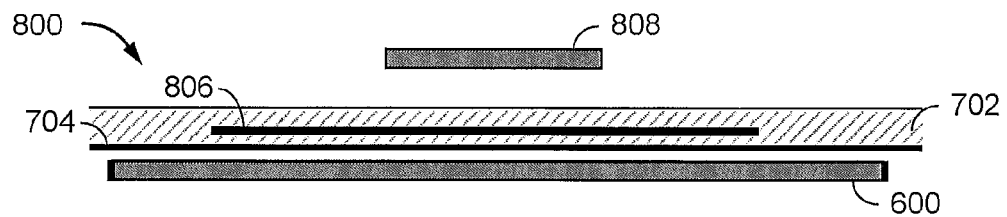
FIG. 8 is a diagram illustrating a side view of the field test tool disposed over a wireless power transmitter, in accordance with an exemplary implementation.

FIG. 8 is a diagram illustrating a side view of an apparatus 800 for wireless power field testing disposed over a wireless power transmitter 600, as referenced in FIG. 6, in accordance with an exemplary implementation. As described above, the wireless power transmitter 600 may include a transmit antenna 604 (FIG. 6) and associated circuitry as previously described in connection with FIGS. 1-4. The apparatus 800 may further include the enclosure 702 (e.g., the plastic enclosure of FIG. 7) and may be configured to hold the sense loop 704. In some implementations, where overlapping loops are utilized, the apparatus 800 may additionally include a sense loop 806 (that overlaps sense loop 704). The diagram additionally shows a receiver coil 808 which may or may not be present during testing of the wireless power transmitter 600. The apparatus 800 depicts how the field test tool 700/reactance test tool 750 of FIGS. 7A and 7B or another wireless power receiver may be located or positioned in relation to the wireless power transmitter during the tests described herein.

Figure 9A:
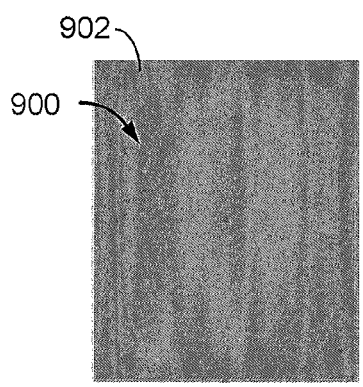
FIG. 9A is a diagram of an unloaded magnetic field as generated by the wireless power transmitter, in accordance with an exemplary implementation.

FIG. 9A is a diagram of an unloaded magnetic field 900 as generated by the wireless power transmitter 600, as referenced in FIG. 6, in accordance with an exemplary implementation. The magnetic field 900 is generated by loop 902, which may correspond to transmit antenna 604 as referenced in FIG. 6. The magnetic field 900 within the loop 902 is shown as being fairly uniform in all locations. For example, as shown in the FIG. 9A, the magnetic field 900 has a substantially constant field representation at all areas within the loop 902. This substantially constant field representation is noted by the lack of gradients shown throughout the area representing the magnetic field 900. The very center of the magnetic field 900 shows an area where the magnetic field 900 is non-uniform (e.g., stronger or weaker than the rest of the area covered by the magnetic field 900). This center area may be the result of overlapping field portions generated from different sections of the loop 902, where each different section is shown bordering a different edge of the magnetic field 900 (darker line near perimeter of FIG. 9A).

Figure 9B:
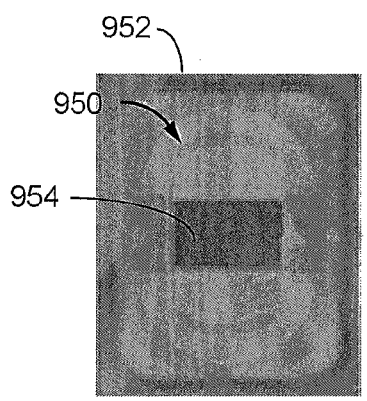
FIG. 9B is a diagram of a loaded magnetic field that is substantially similar to the unloaded magnetic field of FIG. 9A as generated by the wireless power transmitter, in accordance with an exemplary implementation.

FIG. 9B is a diagram of a loaded magnetic field 950 (i.e., the magnetic field having a load being presented to the transmit antenna) as generated by the wireless power transmitter 600, as referenced in FIG. 6, in accordance with an exemplary implementation. The magnetic field 950 is generated by loop 952, which may correspond to transmit antenna 604 as referenced in FIG. 6. The load 954 at the center of the magnetic field 952 may represent a resistive load corresponding to the field test tool 700 of the second primary test described above. The magnetic field 950 within the loop 952 and not at the load 954 is shown as being substantially similar to the unloaded magnetic field 900 and generally uniform in all locations not loaded by load 954. As seen when comparing the magnetic field 950 of FIG. 9B with the magnetic field 900 of FIG. 9A, the gradients (representing the magnetic fields) are similar in the regions outside of the load 954, suggesting that the loaded magnetic field 950 is similar to the unloaded magnetic field 900.

A comparison of magnetic fields 900 and 950 may result in a determination that the wireless power transmitter generating the magnetic fields 900 and 950 passes the operational test, as the unloaded and loaded magnetic fields 900 and 950, respectively, are substantially similar. For example, in some implementations, substantially similar may mean the measured magnetic field 950 after loading is within a few percent of the unloaded magnetic field 900. For example, if the measured strength or uniformity of the magnetic field 950 is within ten percent of the measured strength or uniformity of the magnetic field 900, then the two magnetic fields may be viewed as being substantially similar. In some implementations, the ten percent range may be expanded to be within twenty-five percent. In some implementations, different parameters of the magnetic fields 900 and 950 may be compared and thus may have different ranges within which the magnetic fields 900 and 950 are determined to be substantially similar. For example, field uniformity may be desired to be within ten percent similarity (meaning, the coverage areas of the two magnetic fields 900 and 950 are no more than ten percent different) while field strength or power transfer capabilities of the two magnetic fields 900 and 950 are desired to be within twenty-five percent (meaning, power transfer or field strength at each area within the magnetic field 900 is within 25% of the power transfer or field strength at each corresponding area of the magnetic field 950).

Figure 9C:
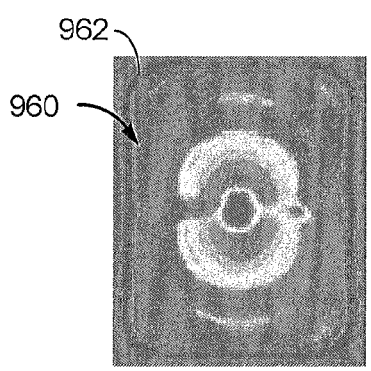
FIG. 9C is a diagram of an unloaded magnetic field as generated by the wireless power transmitter, in accordance with an exemplary implementation.

FIG. 9C is a diagram of an unloaded magnetic field 960 as generated by the wireless power transmitter 600, as referenced in FIG. 6, in accordance with an exemplary implementation. The magnetic field 960 is generated by loop 962, which may correspond to transmit antenna 604 as referenced in FIG. 6. The magnetic field 960 within the loop 962 may not be entirely uniform in all locations (as noted by the various levels of shading in FIG. 9C). The magnetic field 960 and 962 as shown in FIGS. 9C and 9D, respectively, depict different magnetic field levels than FIGS. 9A and 9B discussed above.

Figure 9D:
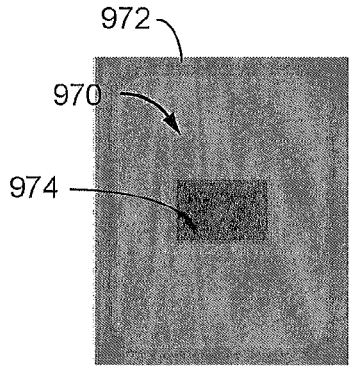
FIG. 9D is a diagram of a loaded magnetic field that is substantially dissimilar to the unloaded magnetic field of FIG. 9C as generated by the wireless power transmitter, in accordance with an exemplary implementation.

FIG. 9D is a diagram of a loaded magnetic field 970 as generated by the wireless power transmitter 600, as referenced in FIG. 6, in accordance with an exemplary implementation. The magnetic field 970 is generated by loop 972, which may correspond to transmit antenna 604 as referenced in FIG. 6. The load 974 at the center of the magnetic field 972 may represent a resistive load of the second operational test described above. The magnetic field 970 within the loop 972 and not at the load 974 is shown as being substantially different to the unloaded magnetic field 960 while being generally uniform in all locations not loaded by load 974. When compared to the magnetic field 960 of FIG. 9C, which shows different gradients throughout the area covered by the magnetic field 960, it can be determined that the magnetic fields 960 and 970 are substantially different because the gradients at corresponding locations are substantially different from each other (i.e., represent different colors or levels).

A comparison of magnetic fields 960 and 970 may result in a determination that the wireless power transmitter generating the magnetic fields 960 and 970 fails the primary test, as the unloaded and loaded magnetic fields 960 and 970, respectively, are substantially dissimilar. Thus, as the field test tools 700 may act as the load 974, the field test tools may impact the magnetic fields 960 and 970, which may result in the determination that the two magnetic fields 960 and 970 are not substantially similar. For example, in some implementations, substantially similar may indicate that the measured magnetic field 970, after loading is within a few percent (e.g., 0-5%) of the unloaded magnetic field 960 or within a specified range or may be based on the uniformity standard discussed above. For example, if the measured strength or uniformity of the magnetic field 960 is within ten percent (0-10%) of the measured strength or uniformity of the magnetic field 970, then the two magnetic fields may be viewed as being substantially similarly. In some implementations, the ten percent range may be expanded to be within twenty-five percent (0-25%). In some implementations, different parameters of the magnetic fields 960 and 970 may be compared and thus may have different ranges within which the magnetic fields 960 and 970 are determined to be substantially similar. For example, field uniformity may be desired to be within ten percent similarity (meaning, the coverage areas of the two magnetic fields 960 and 970 are no more than ten percent different) while field strength or power transfer capabilities of the two magnetic fields 960 and 970 are desired to be within twenty-five percent (meaning, power transfer or field strength at each area within the magnetic field 960 is within 25% of the power transfer or field strength at each corresponding area of the magnetic field 970).

FIG. 10 is a flowchart of an exemplary method 1000 for testing of a wireless power transmitter, in accordance with an exemplary implementation. The steps or actions described in FIG. 10 may implemented or utilize any of the circuits and/or devices shown in any of FIGS. 4-8. Block 1002 may include generating a magnetic field via a transmit antenna. As described above in connection with one or more of FIGS. 6-8B, a magnetic field may be generated by the wireless power transmitter 600 (having a transmit antenna 604) to allow for wireless power transfer from the wireless power transmitter 600 to a wireless power receiver placed within the generated magnetic field. Block 1004 may include identifying a first uniformity level of the magnetic field based on a comparison of a plurality of measurements of the magnetic field at a plurality of locations on a charging surface of the wireless power transmitter. For example, the open circuit voltage may be measured (identified) by the field test tool 700 (referring to FIG. 7A). For example, an AC voltage proportional to the magnetic field passing through the area encompassed by a particular sense loop 704 of the field test tool 700 may be induced across the terminals of that particular conductive loop. Alternatively, the field test tool 700 may be used to measure the resistance range of the wireless power transmitter 600 or the reactance shift range of the wireless power transmitter 600, respectively. Block 1006 may comprise comparing the plurality of measurements of the magnetic field with a predetermined range of values for the plurality of locations on the charging surface of the wireless power transmitter, where the magnetic field is determined to be uniform if the plurality of measurements of the magnetic field are within the predetermined range of values for a majority of the plurality of locations on the charging surface.

This may comprise determining (comparing) that the open circuit voltages measured in block 1004 are within the specified range of values at the locations of the charging surface within the magnetic field. In an implementation, for example, the method 1000 may be performed by the apparatus 800 of FIG. 8.

Figure 11:
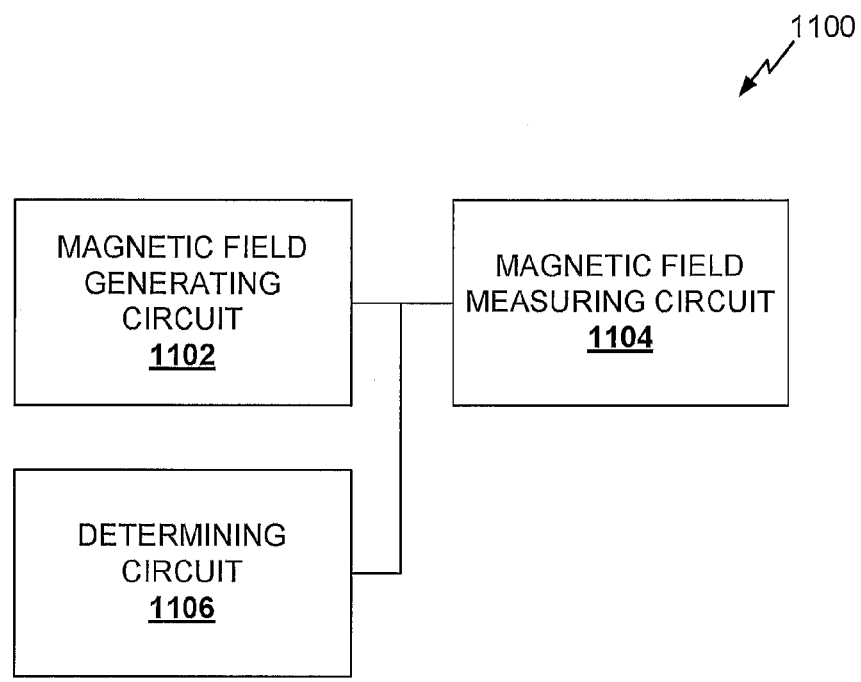
FIG. 11 is a functional block diagram of an apparatus for testing the wireless power transmitter, in accordance with an exemplary implementation.

FIG. 11 is a functional block diagram of an apparatus for testing the wireless power transmitter 600, in accordance with an exemplary implementation. Those skilled in the art will appreciate that an apparatus for testing the wireless power transmitter may have more or fewer components than the simplified apparatus 1100 shown in FIG. 11. The apparatus 1100 shown includes only those components useful for describing some prominent features of implementations within the scope of the claims.

The apparatus 1100 includes a magnetic field generating circuit 1102. In an implementation, the magnetic field generating circuit 1102 may be configured can be configured to perform one or more of the functions described above with respect to block 1002 of FIG. 10. In various implementations, the magnetic field generating circuit 1102 can be implemented by one or more of the circuits shown in any of FIGS. 1-4 and 6. In various implementations, the means for generating a magnetic field may comprise the magnetic field generating circuit 1102.

The apparatus 1100 further includes a magnetic field measuring circuit 1104. In an implementation, the magnetic field measuring circuit 1104 can be configured to perform one or more of the functions described above with respect to block 1004. In various implementations, the magnetic field measuring circuit 1104 can be implemented by one or more of the devices shown in FIGS. 7A and 7B. In some implementations, the means for measuring a first uniformity of the magnetic field at the locations within the magnetic field may comprise the magnetic field measuring circuit 1104.

The apparatus 1100 further includes a determining circuit 1106. In an implementation, the determining circuit 1106 can be configured to perform one or more of the functions described above with respect to block 1006. In various implementations, the determining circuit 1106 can be implemented by one or more of the devices shown in FIGS. 7A and 7B. In some implementations, the means for determining that the measured first uniformity of the magnetic field is within a specified range of values at the locations within the magnetic field may comprise the determining circuit 1106.

Figure 12:
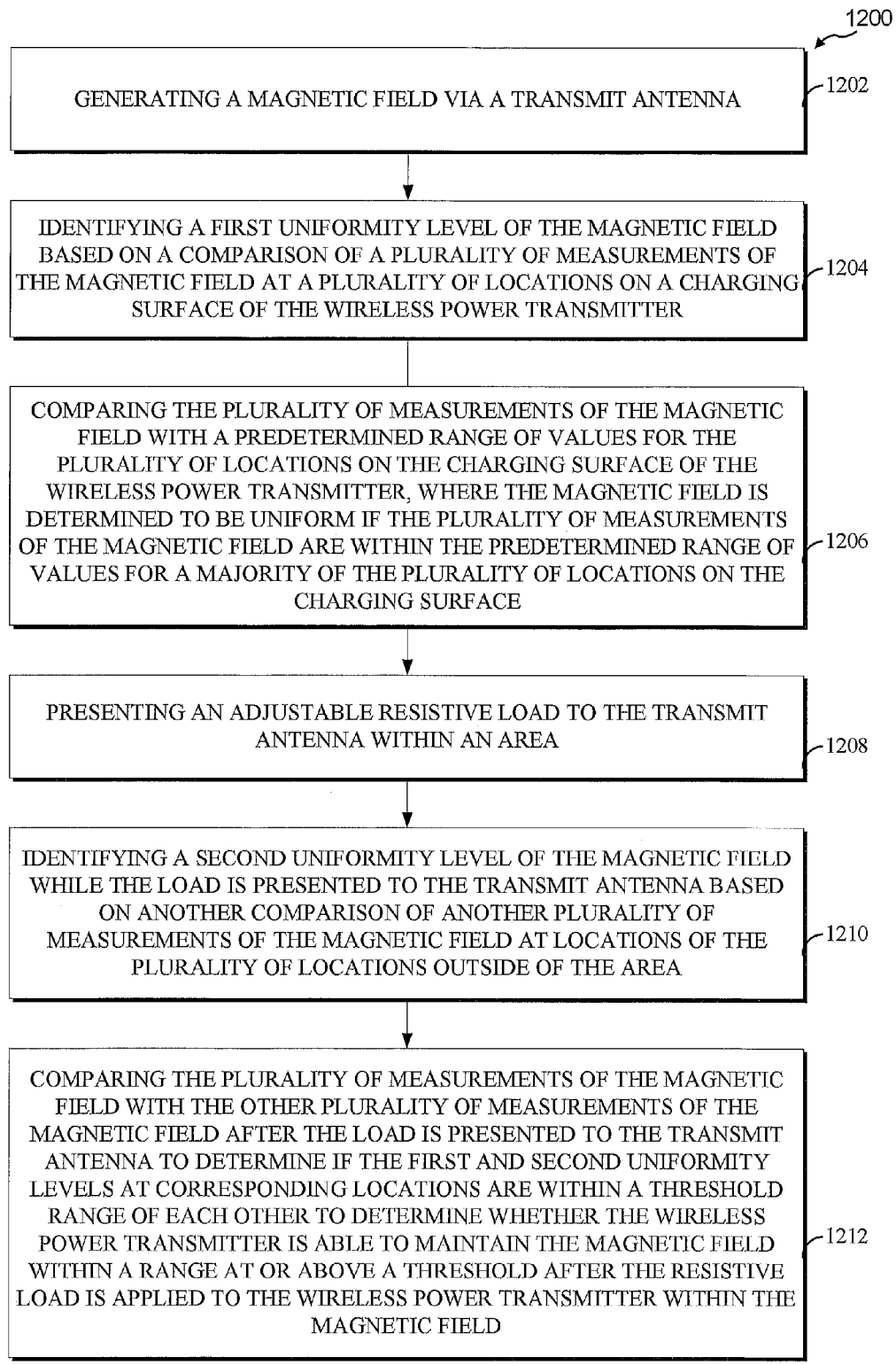
FIG. 12 is a flowchart of an exemplary method implementing an operational test of a wireless power transmitter, in accordance with an exemplary implementation.

FIG. 12 is a flowchart of an exemplary method 1200 implementing an operational test of a wireless power transmitter, in accordance with an exemplary implementation. The steps or actions described in FIG. 12 may implemented or utilize any of the circuits and/or devices shown in any of FIGS. 4-8.

Block 1202 may include generating a magnetic field via a transmit antenna. As described above in connection with one or more of FIGS. 6-8B, a magnetic field may be generated by the wireless power transmitter 600 (having a transmit antenna 604) to allow for wireless power transfer from the wireless power transmitter 600 to a wireless power receiver placed within the generated magnetic field.

Block 1204 may include identifying a first uniformity level of the magnetic field based on a comparison of a plurality of measurements of the magnetic field at a plurality of locations on a charging surface of the wireless power transmitter. For example, the open circuit voltage may be measured (identified) by the field test tool 700 (referring to FIG. 7A). An AC voltage proportional to the magnetic field passing through the area encompassed by a particular sense loop 704 of the field test tool 700 may be induced across the terminals of that particular conductive loop. In some implementations, the magnetic field may be measured at e.g., twenty locations evenly spaced across the charging surface of the wireless power transmitter or some other number of points that achieves good coverage of the entire charging area. In some implementations, the twenty points may be replaced with thirty points or ten points. In some implementations, the number of measurement locations may be dependent upon the size of the charging surface and the transmitter antenna size, such that the measurements provide accurate measures of the magnetic field. In some implementations, the number of measurement locations may be dependent upon the size of the charging surface and a minimum distance between measurement locations (e.g., no more than 1 inch between measurement locations for a charging surface of 4 inches square may utilize 5 measurement locations). Alternatively, the field test tool 700 may be used to measure the resistance range of the wireless power transmitter 600 or the reactance shift range of the wireless power transmitter 600, respectively.

Block 1206 may comprise comparing the plurality of measurements of the magnetic field with a predetermined range of values for the plurality of locations on the charging surface of the wireless power transmitter, where the magnetic field is determined to be uniform if the plurality of measurements of the magnetic field are within the predetermined range of values for a majority of the plurality of locations on the charging surface. This may comprise comparing the open circuit voltages measured in block 1204 with the specified range of values at the locations and determining that the open circuit voltages are within the specified range. In an implementation, for example, the method 1200 may be performed by the apparatus 800 of FIG. 8.

Block 1208 may comprise presenting an adjustable resistive load to the transmit antenna within an area. In some implementations, the load may be an adjustable, resistive load. In some of those implementations, the load may be adjusted to a predetermined resistance value (e.g., some maximum or minimum resistance value that may be presented by a receiver). As described above, the adjustable, resistive load may be varied within maximum and minimum values to test the wireless power transmitter's ability to maintain the magnetic field at unloaded locations within the magnetic field. In implementations where the wireless power transmitter is configured to provide power to multiple wireless power receivers, the test implemented by method 1200 may comprise a plurality of loads presented to the magnetic field. In some implementations, one or more of the load may be adjustable, resistive loads being presented to the magnetic field at once.

Block 1210 may comprise identifying a second uniformity level of the magnetic field while the load is presented to the transmit antenna based on another comparison of another plurality of measurements of the magnetic field at locations of the plurality of locations outside of the area. This may comprise the same process as block 1204, just being performed after the load is presented to the magnetic field and at locations not loaded by the load.

Block 1212 comprises comparing the plurality of measurements of the magnetic field with the other plurality of measurements of the magnetic field after the load is presented to the transmit antenna to determine if the first and second uniformity levels at corresponding locations are within a threshold range of each other to determine whether the wireless power transmitter is able to maintain the magnetic field within a range at or above a threshold after the resistive load is applied to the wireless power transmitter within the magnetic field. In some implementations, if the second (loaded) uniformity is substantially similar to the first (unloaded) uniformity, then the method 1200 may determine that the wireless power transmitter being tested is capable of maintaining the magnetic field, and, thus, passes the operational test. If the second uniformity is substantially different from the first uniformity, then the method 1200 may determine that the wireless power transmitter being tested is not capable of maintaining the magnetic field, and, thus, fails the operational test.

Figure 13:
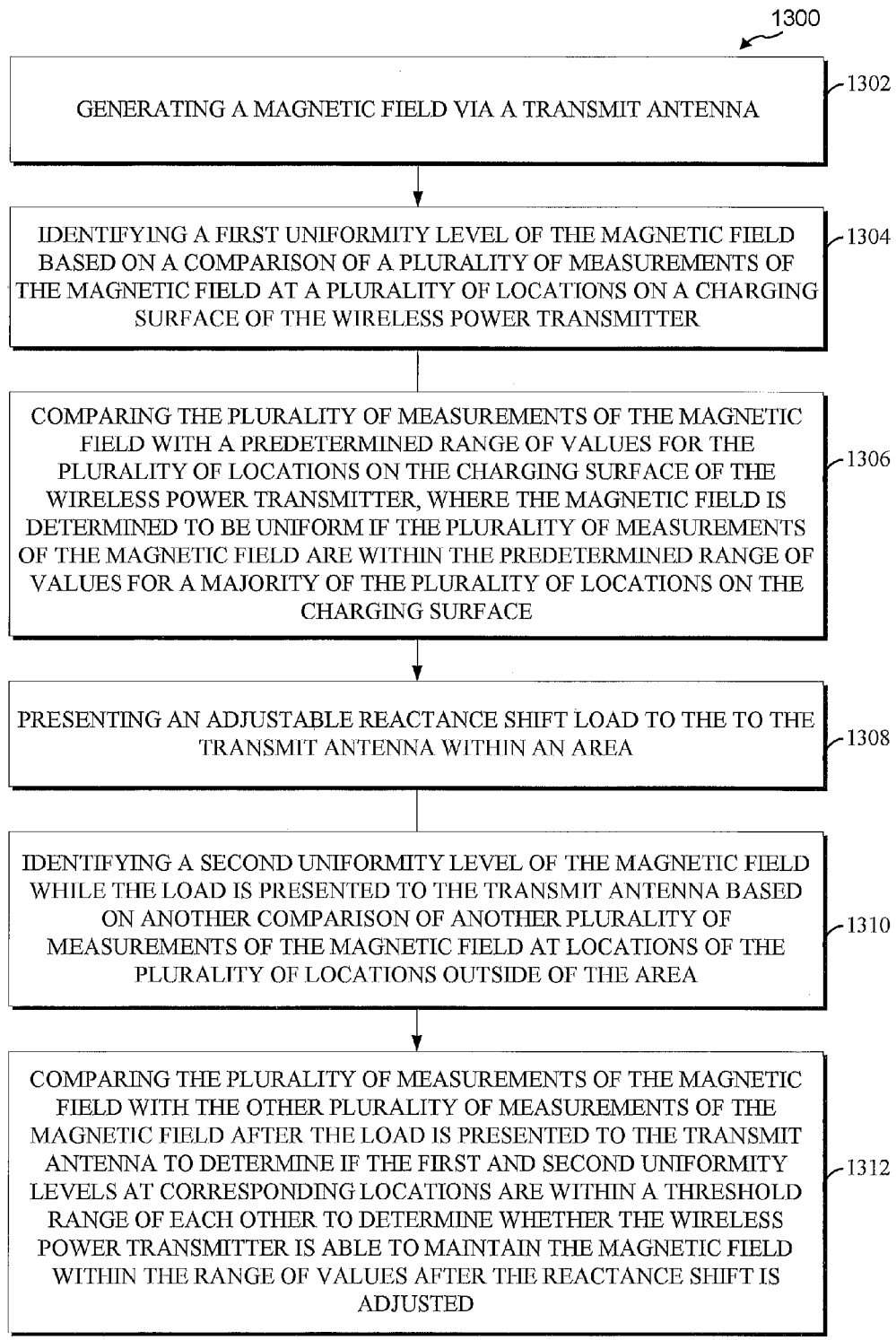
FIG. 13 is a flowchart of an exemplary method implementing a design test of a wireless power transmitter, in accordance with an exemplary implementation.

FIG. 13 is a flowchart of an exemplary method 1300 implementing a design test of a wireless power transmitter, in accordance with an exemplary implementation. The steps or actions described in FIG. 13 may implemented or utilize any of the circuits and/or devices shown in any of FIGS. 4-8.

Block 1302 may include generating a magnetic field via a transmit antenna. As described above in connection with one or more of FIGS. 6-8B, a magnetic field may be generated by the wireless power transmitter 600 (having a transmit antenna 604) to allow for wireless power transfer from the wireless power transmitter 600 to a wireless power receiver placed within the generated magnetic field.

Block 1304 may include identifying a first uniformity level of the magnetic field based on a comparison of a plurality of measurements of the magnetic field at a plurality of locations on a charging surface of the wireless power transmitter. In some implementations, the first uniformity may be measured at locations within the magnetic field on a charging surface of the wireless power transmitter. For example, the open circuit voltage may be measured by the field test tool 700 (referring to FIG. 7A). An AC voltage proportional to the magnetic field passing through the area encompassed by a particular sense loop 704 of the field test tool 700 may be induced across the terminals of that particular conductive loop. Alternatively, the field test tool 700 may be used to measure the resistance range of the wireless power transmitter 600 or the reactance shift range of the wireless power transmitter 600, respectively.

Block 1306 may comprise comparing the plurality of measurements of the magnetic field with a predetermined range of values for the plurality of locations on the charging surface of the wireless power transmitter, where the magnetic field is determined to be uniform if the plurality of measurements of the magnetic field are within the predetermined range of values for a majority of the plurality of locations on the charging surface. This may comprise determining that the open circuit voltages measured in block 1304 are within the specified range of values at the locations of the charging surface within the magnetic field. In an implementation, for example, the method 1200 may be performed by the apparatus 800 of FIG. 8.

Block 1308 may comprise presenting an adjustable reactance shift load to the to the transmit antenna within an area. In some implementations, the load may be an adjustable, reactance shift load. This differs from the resistive load added in method 1200 above. The reactance shift load represents or corresponds to an amount of reactance a receiver would cause on the transmit antenna (the load acting as the receiver). The reactance shift may be caused by the material of the load, where a large metal material content may cause a capacitive shift, while a large permeable material content may cause an inductive shift. In some embodiments, as described above, the load presented to the magnetic field may be adjusted to a capacitive (i.e., simulating a receiver with a large metal content) or a inductive (e.g., simulating a receiver with a large ferrite or permeable material content) reactance value. As described above, the load may be varied within maximum and minimum values to test the wireless power transmitter's ability to maintain the magnetic field at unloaded locations within the magnetic field. In implementations where the wireless power transmitter is configured to provide power to multiple wireless power receivers, the test implemented by method 1300 may comprise a plurality of loads being presented to the magnetic field. In some implementations, one or more of the loads may comprise an adjustable, reactance shift load where the one or more loads are applied to the magnetic field at once.

Block 1310 may comprise identifying a second uniformity level of the magnetic field while the load is presented to the transmit antenna based on another comparison of another plurality of measurements of the magnetic field at locations of the plurality of locations outside of the area. This may comprise the same process as block 1304 performed after the adjustable, reactance shift load is presented to the magnetic field and at locations not loaded by the adjustable, reactance shift load.

Block 1312 comprises comparing the plurality of measurements of the magnetic field with the other plurality of measurements of the magnetic field after the load is presented to the transmit antenna to determine if the first and second uniformity levels at corresponding locations are within a threshold range of each other to determine whether the wireless power transmitter is able to maintain the magnetic field within the range of values after the reactance shift is adjusted. If the second (loaded) uniformity is substantially similar to the first (unloaded) uniformity, then the method 1300 may determine that the wireless power transmitter being tested is capable of maintaining the magnetic field, and, thus, passes the design test. If the second uniformity is substantially different from the first uniformity, then the method 1300 may determine that the wireless power transmitter being tested is not capable of maintaining the magnetic field, and, thus, fails the design test.

As described above, maintaining the magnetic field generated by the wireless power transmitter (e.g., the transmit antenna) may correspond to the wireless power transmitter being able to maintain its transmitter loop current while being subject to a maximum load by one or more wireless power receivers. This may apply to both resistive and reactive shift tests. Maintaining the transmitter loop current may correspond to maintaining the transmitter loop current above a defined threshold (e.g., above 25% or 50% of the unloaded transmitter loop current or at a current sufficient to wirelessly transfer a minimum amount of power to a minimum distance, etc.).

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and method steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose hardware processor, a Digital Signal Processor (DSP), an Application Specified Integrated Circuit (ASIC), a Field Programmable Gate Array (FPGA) or other programmable logic device, discrete gate or transistor logic, discrete hardware components, or any combination thereof designed to perform the functions described herein. A general purpose hardware processor may be a microprocessor, but in the alternative, the hardware processor may be any conventional processor, controller, microcontroller, or state machine. A hardware processor may also be implemented as a combination of computing devices, e.g., a combination of a DSP and a microprocessor, a plurality of microprocessors, one or more microprocessors in conjunction with a DSP core, or any other such configuration.

The steps of a method and functions described in connection with the implementations disclosed herein may be embodied directly in hardware, in a software module executed by a hardware processor, or in a combination of the two. If implemented in software, the functions may be stored on or transmitted as one or more instructions or code on a tangible, non-transitory computer readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the hardware processor such that the hardware processor can read information from, and write information to, the storage medium. In the alternative, the storage medium may be integral to the hardware processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of computer readable media. The hardware processor and the storage medium may reside in an ASIC.

For purposes of summarizing the disclosure, certain aspects, advantages and novel features s have been described herein. It is to be understood that not necessarily all such advantages may be achieved in accordance with any particular implementation. Thus, the invention may be embodied or carried out in a manner that achieves or optimizes one advantage or group of advantages as taught herein without necessarily achieving other advantages as may be taught or suggested herein.

Various modifications of the above-described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. A method of testing a wireless power transmitter, comprising:
   generating a magnetic field via a transmit antenna;
   identifying a first uniformity level of the magnetic field based on a comparison of a plurality of measurements of the magnetic field at a plurality of locations on a charging surface of the wireless power transmitter; and
   comparing the plurality of measurements of the magnetic field with a predetermined range of values for the plurality of locations on the charging surface of the wireless power transmitter, where the magnetic field is determined to be uniform if the plurality of measurements of the magnetic field are within the predetermined range of values for a majority of the plurality of locations on the charging surface.

2. The method of claim 1, further comprising:
   presenting a load to the transmit antenna within an area;
   identifying a second uniformity level of the magnetic field while the load is presented to the transmit antenna based on another comparison of another plurality of measurements of the magnetic field at locations of the plurality of locations outside of the area; and
   comparing the plurality of measurements of the magnetic field with the other plurality of measurements of the magnetic field after the load is presented to the transmit antenna to determine if the first and second uniformity levels at corresponding locations are within a threshold range of each other.

3. The method of claim 2, wherein presenting a load to the transmit antenna comprises presenting a resistive load to the transmit antenna within the magnetic field, and wherein comparing the plurality of measurements of the magnetic field with the other plurality of measurements of the magnetic field comprises comparing the plurality of measurements with the other plurality of measurements to determine whether the wireless power transmitter is able to maintain the magnetic field within a range at or above a threshold after the resistive load is applied to the wireless power transmitter within the magnetic field.

4. The method of claim 3, wherein the resistive load presented is presented via an external device, and wherein the external device is configured to vary the resistive load from a minimum value to a maximum value.

5. The method of claim 3, wherein presenting a resistive load to the transmit antenna comprises presenting a plurality of resistive loads to the transmit antenna.

6. The method of claim 2, wherein presenting the load comprises presenting an adjustable amount of reactance shift at the transmit antenna of the wireless power transmitter, and wherein comparing the plurality of measurements with the other plurality of measurements comprises comparing the pluralities of measurements to determine whether the wireless power transmitter is able to maintain the magnetic field within the range of values after the reactance shift is adjusted.

7. The method of claim 6, wherein the adjustable amount of reactance shift is adjusted to be at least one of more capacitive or more inductive.

8. The method of claim 2, wherein presenting the load to the transmit antenna comprises presenting a plurality of adjustable, resistive loads to the transmit antenna.

9. The method of claim 1, wherein identifying a first uniformity level of the magnetic field comprises identifying the first uniformity level of the magnetic field based on a comparison of a plurality of open circuit voltage measurements of the magnetic field at the plurality of locations on the charging surface of the wireless power transmitter.

10. The method of claim 1, wherein the plurality of locations comprises all locations of the charging surface such that the plurality of measurements of the magnetic field comprises measurements of the magnetic field at all locations of the charging surface of the wireless power transmitter.

11. A method of testing a wireless power transmitter, comprising:
generating a magnetic field via a transmit antenna;
measuring a plurality of values indicative of a magnitude of the magnetic field at a plurality of locations of a charging surface of the wireless power transmitter; and
determining that the plurality of values indicative of the magnitude of the magnetic field is within a predetermined range of values at the plurality of locations.

12. The method of claim 11, wherein the plurality of values comprises a plurality of open circuit voltages of a test circuit configured to be selectively positioned at the plurality of locations.

13. The method of claim 11, further comprising:
presenting a load to the transmit antenna at an area via an external device configured to couple to the magnetic field;
measuring another plurality of values indicative of the magnitude of the magnetic field at locations of the plurality of locations outside the area; and
determining that the other plurality of values are within the predetermined range of values.

14. The method of claim 13, wherein values of the other plurality of values after the external device is presented to the transmit antenna are within a threshold range of corresponding values of the plurality of values prior to the external device being presented to the transmit antenna.

15. The method of claim 11, further comprising:
adjusting a resistance presented to the transmit antenna via an external device configured to couple to the magnetic field across a pre-determined range of resistances;
measuring another plurality of values indicative of the magnitude of the magnetic field at another plurality of locations where the external device is not presented to the transmit antenna as the resistance is adjusted across the pre-determined range of resistances; and
determining that the plurality of values are within the predetermined range of values.

16. The method of claim 11, further comprising:
adjusting a resistance presented to the transmit antenna via a plurality of external devices configured to couple to the magnetic field across a pre-determined range of resistances;
measuring another plurality of values indicative of the magnitude of the magnetic field at another plurality of locations where the plurality of external devices are not presented to the transmit antenna as the resistance is adjusted across the pre-determined range of resistances; and
determining that the plurality of values are within the predetermined range of values.

17. The method of claim 11, further comprising:
adjusting a reactance shift presented to the transmit antenna via an external device configured to couple to the magnetic field across a pre-determined range of reactance shifts;
measuring another plurality of values indicative of the magnitude of the magnetic field at another plurality of locations where the external device is not presented to the transmit antenna as the reactance shift is adjusted across the pre-determined range of reactance shifts; and
determining that the plurality of values are within the predetermined range of values.

18. The method of claim 11, further comprising:
adjusting a reactance shift presented to the transmit antenna via a plurality of external devices configured to couple to the magnetic field across a pre-determined range of reactance shifts;
measuring another plurality of values indicative of the magnitude of the magnetic field at another plurality of locations where the plurality of external devices are not presented to the transmit antenna as the reactance shift is adjusted across the pre-determined range of reactance shifts; and
determining that the plurality of values are within the predetermined range of values.

19. The method of claim 17, wherein adjusting the reactance shift comprises adjusting the reactance shift to be at least one of more capacitive or more inductive.

20. A system for testing a wireless power transmitter, comprising:
a measurement device configured to measure a plurality of values indicative of a magnitude of a magnetic field generated by a transmit antenna of the wireless power transmitter at a plurality of locations of a charging surface of the wireless power transmitter; and a processor configured to determine that the plurality of values indicative of the magnitude of the magnetic field is within a predetermined range of values at the plurality of locations.

21. The system of claim 20, further comprising:

a load configured to be presented to the transmit antenna at an area via an external device configured to couple to the magnetic field and wherein the measurement device is further configured to measure another plurality of values indicative of the magnitude of the magnetic field at locations of the plurality of locations outside the area and wherein the processor is further configured to determine that the other plurality of values are within the predetermined range of values.

22. The system of claim 21, wherein a load comprises a resistive load and wherein the processor is configured to determine whether the wireless power transmitter is able to maintain the magnetic field within a range or above a threshold after the resistive load is applied to the wireless power transmitter within the magnetic field.

23. The system of claim 22, wherein the resistive load is presented via the external device and wherein the external device is configured to vary the resistive load from a minimum value to a maximum value.

24. The system of claim 21, further comprising:

an adjustable reactance shift configured to be presented to the transmit antenna via an external device configured to couple to the magnetic field across a pre-determined range of reactance shifts, wherein the measurement device is further configured to measure another plurality of values indicative of the magnitude of the magnetic field at another plurality of locations where the external device is not presented to the transmit antenna as the reactance shift is adjusted across the pre-determined range of reactance shifts and wherein the processor is further configured to determine that the plurality of values are within the predetermined range of values.

25. The system of claim 24, wherein the adjustable reactance shift is configured to be adjusted to be at least one of more capacitive or more inductive.

26. A system for testing a wireless power transmitter, comprising:

means for measuring a plurality of values indicative of a magnitude of a magnetic field generated by a transmit antenna of the wireless power transmitter at a plurality of locations of a charging surface of the wireless power transmitter; and means for determining that the plurality of values indicative of the magnitude of the magnetic field is within a predetermined range of values at the plurality of locations.

27. The system of claim 26, further comprising means for coupling to the magnetic field configured to be presented to the transmit antenna at an area and wherein the means for measuring is further configured to measure another plurality of values indicative of the magnitude of the magnetic field at locations of the plurality of locations outside the area and wherein the means for determining is further configured to determine that the other plurality of values are within the predetermined range of values.

28. The system of claim 27, wherein the means for coupling comprises a resistive load and wherein the means for determining is further configured to determine whether the wireless power transmitter is able to maintain the magnetic field within a range or above a threshold after the resistive load is presented to the wireless power transmitter within the magnetic field.

29. The system of claim 28, wherein the resistive load is presented via an external device and wherein the external device is configured to vary the resistive load from a minimum value to a maximum value.

30. The system of claim 26, further comprising:

means for coupling to the magnetic field across a pre-determined range of reactance shifts configured to be presented to the transmit antenna, wherein the means for measuring is further configured to measure another plurality of values indicative of the magnitude of the magnetic field at another plurality of locations where the means for coupling is not presented to the transmit antenna as the reactance shift is adjusted across the pre-determined range of reactance shifts and wherein the means for determining is further configured to determine that the plurality of values are within the predetermined range of values.

* * * * *